United States Patent
Lai et al.

(10) Patent No.: US 8,648,401 B2
(45) Date of Patent: Feb. 11, 2014

(54) DOMAIN WALL ASSISTED SPIN TORQUE TRANSFER MAGNETRESISTIVE RANDOM ACCESS MEMORY STRUCTURE

(75) Inventors: Chih-Huang Lai, Hsinchu (TW); Sheng-Huang Huang, Tainan (TW); Kuo-Feng Huang, Donshi Township, Taichung County (TW); Ming-Te Liu, Taipei (TW); Chun-Jung Lin, Hsinchu (TW); Ya-Chen Kao, Fuxing Township, Taoyuan County (TW); Wen-Cheng Chen, Chiunglin Shiang Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 280 days.

(21) Appl. No.: 12/884,351

(22) Filed: Sep. 17, 2010

(65) Prior Publication Data
US 2012/0068279 A1    Mar. 22, 2012

(51) Int. Cl.
*H01L 21/02* (2006.01)

(52) U.S. Cl.
USPC ............... 257/295; 257/421; 257/E27.104; 257/E29.164; 438/3; 365/145; 365/171; 365/173

(58) Field of Classification Search
USPC .............. 257/295, 421, E27.104, E29.164; 438/3; 365/145, 171, 173
See application file for complete search history.

(56) References Cited

U.S. PATENT DOCUMENTS

| 2005/0002229 A1* | 1/2005 | Matsutera et al. ............ 365/171 |
| 2010/0142264 A1* | 6/2010 | Numata et al. ................ 365/171 |

FOREIGN PATENT DOCUMENTS

| JP | 2009-081390 | 4/2009 |
| WO | WO-2009-093387 A1 | 10/2008 |
| WO | WO-2009-101827 A1 | 1/2009 |
| WO | WO-2010-004881 A1 | 6/2009 |

OTHER PUBLICATIONS

Zhu, Xiaochun, et al., "A Vertical MRAM Free of Write Disturbance," IEEE Transactions on Magnetics, vol. 39, No. 5, Sep. 2003, p. 2854-2856.

* cited by examiner

*Primary Examiner* — Kenneth Parker
*Assistant Examiner* — John Lin
(74) *Attorney, Agent, or Firm* — Haynes and Boone, LLP

(57) ABSTRACT

A semiconductor memory device includes a first ferromagnetic layer magnetically pinned and positioned within a first region of a substrate; a second ferromagnetic layer approximate the first ferromagnetic layer; and a barrier layer interposed between the first ferromagnetic layer and the first portion of the second ferromagnetic layer. The second ferromagnetic layer includes a first portion being magnetically free and positioned within the first region; a second portion magnetically pinned to a first direction and positioned within a second region of the substrate, the second region contacting the first region from a first side; and a third portion magnetically pinned to a second direction and positioned within a third region of the substrate, the third region contacting the first region from a second side.

14 Claims, 13 Drawing Sheets

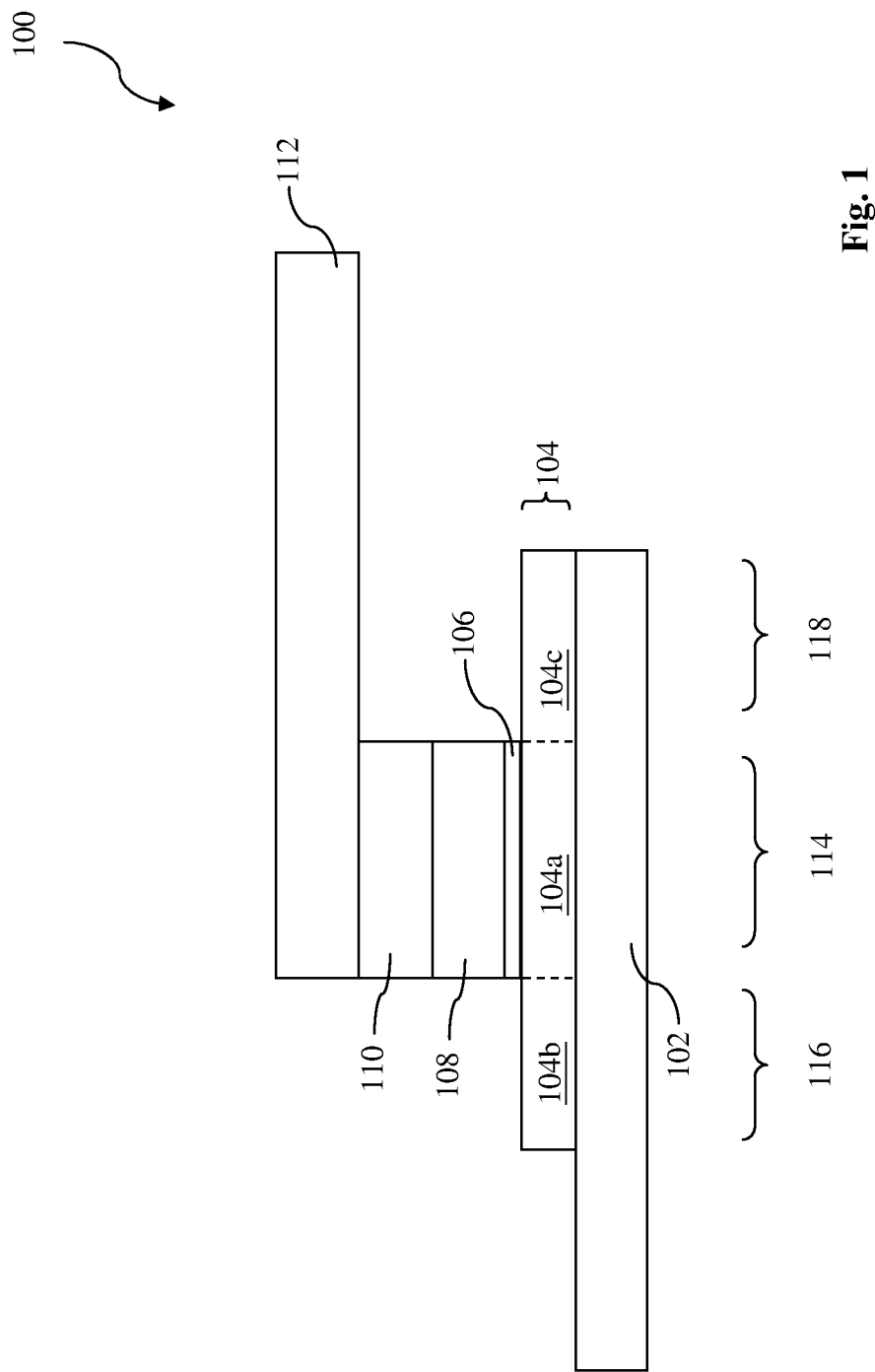

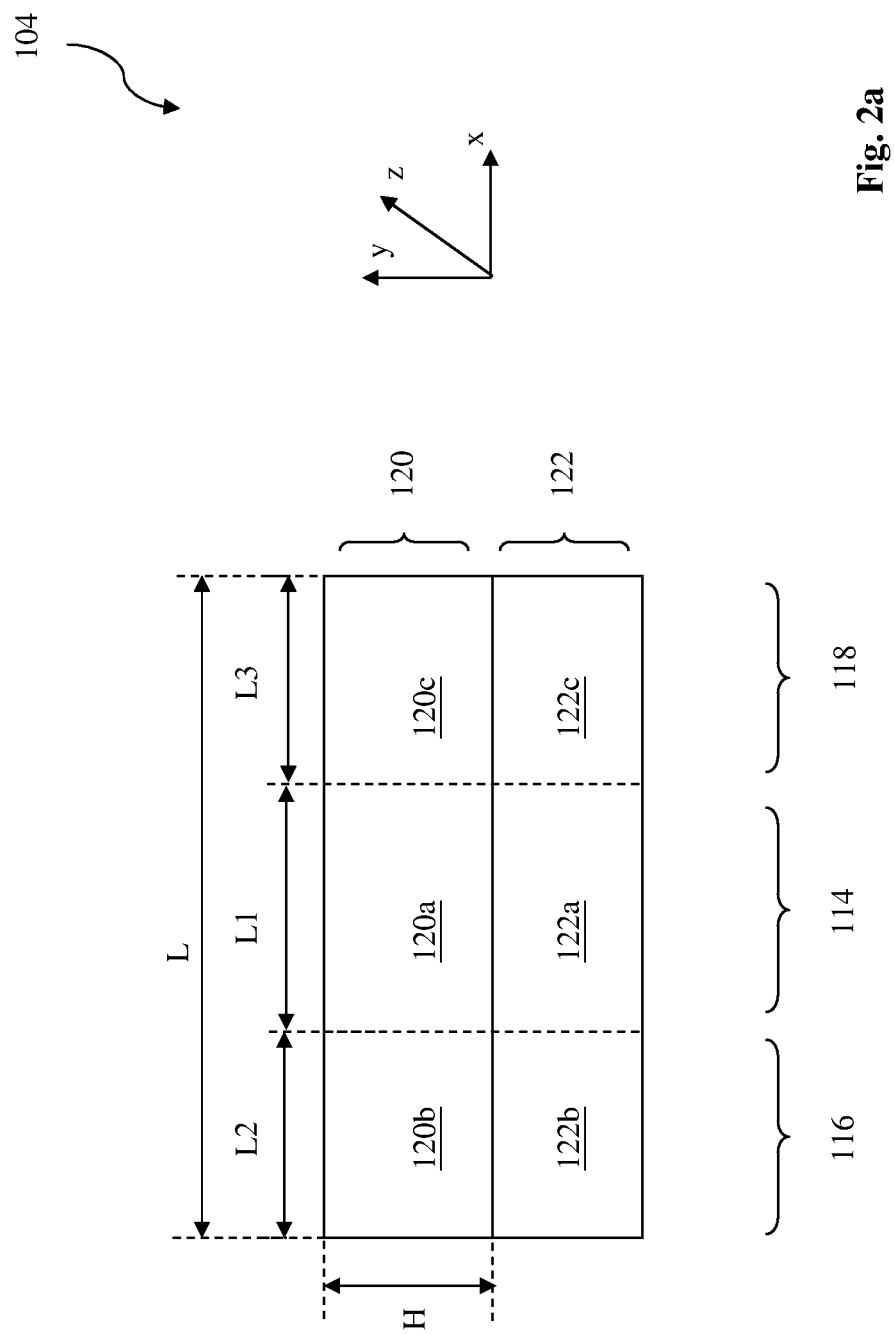

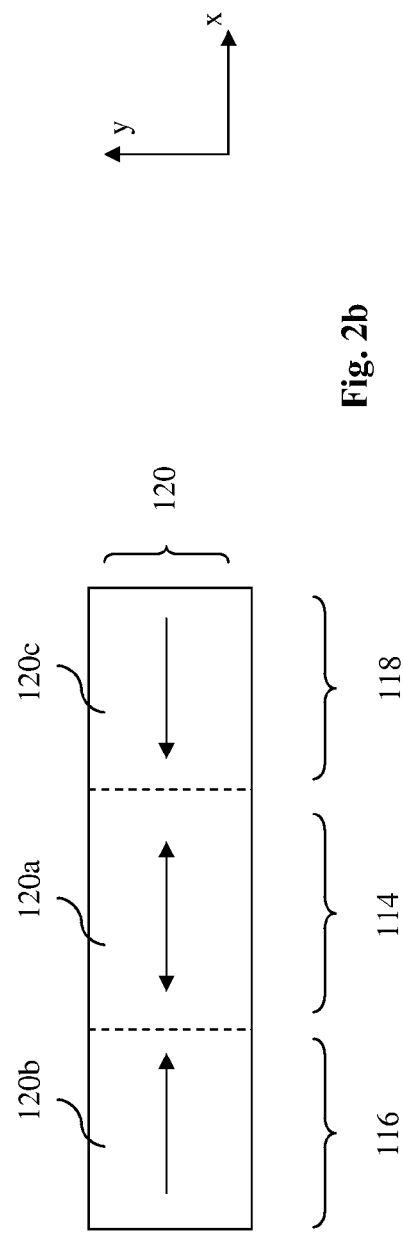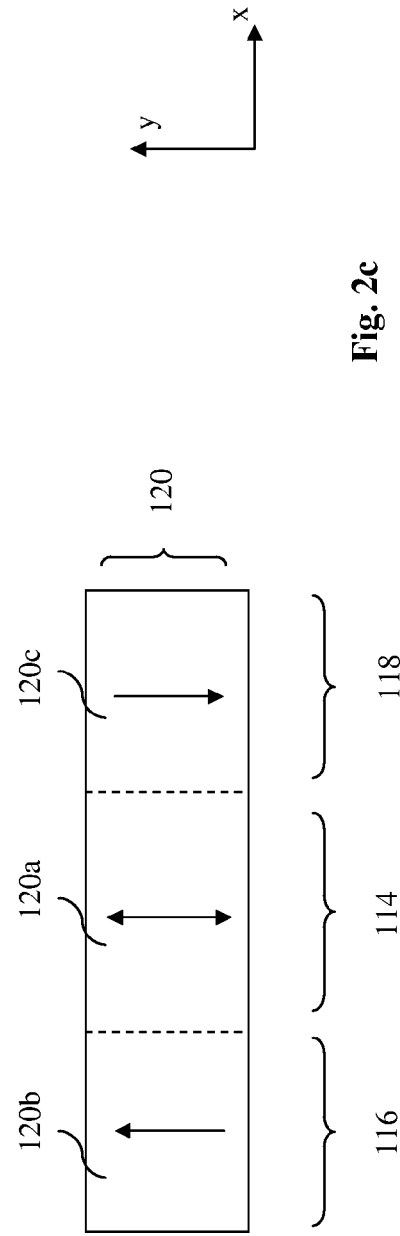

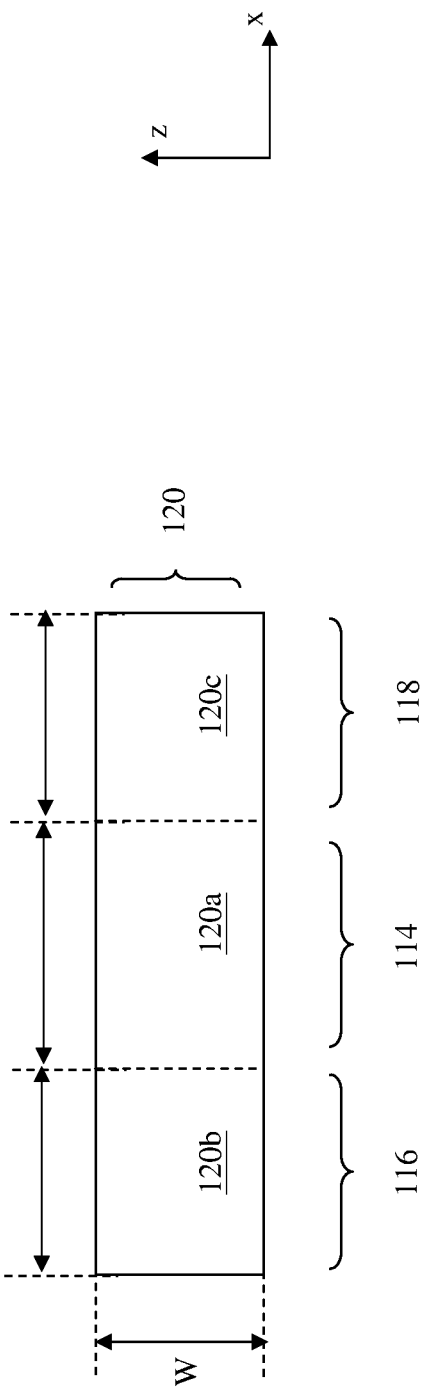

DOMAIN WALL ASSISTED SPIN TORQUE TRANSFER MAGNETRESISTIVE RANDOM ACCESS MEMORY STRUCTURE

BACKGROUND

In semiconductor integrated circuit (IC) devices, spin torque transfer magnetic random access memory (STT-MRAM) is an emerging technology for next generation embedded memory devices. Semiconductor IC technology is also continually progressing to circuit layouts having smaller feature sizes as well as increased density. However, a large writing current will limit the scaling of the transistor and will lead to a large cell size. As a result of this continuous progression, the reduction of the writing current is a challenging issue. Some existing approaches may be able to reduce the writing current but will also unexpectedly reduce the tunnel magnetoresistance (TMR) and the thermal stability of the STT-MRAM device. Accordingly, it would be desirable to provide an improved STT-MRAM structure and method of manufacturing thereof absent the disadvantages discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1 is a sectional view illustrating an embodiment of a semiconductor memory device constructed according to aspects of the present disclosure.

FIG. 2a is a sectional view illustrating a modified free layer of the semiconductor memory device of FIG. 1.

FIGS. 2b and 2c are sectional views of a modified free layer in various embodiments constructed according to various aspects of the present disclosure.

FIG. 2d is a top view of the modified free layer of FIG. 2a.

DETAILED DESCRIPTION

Figure 3:
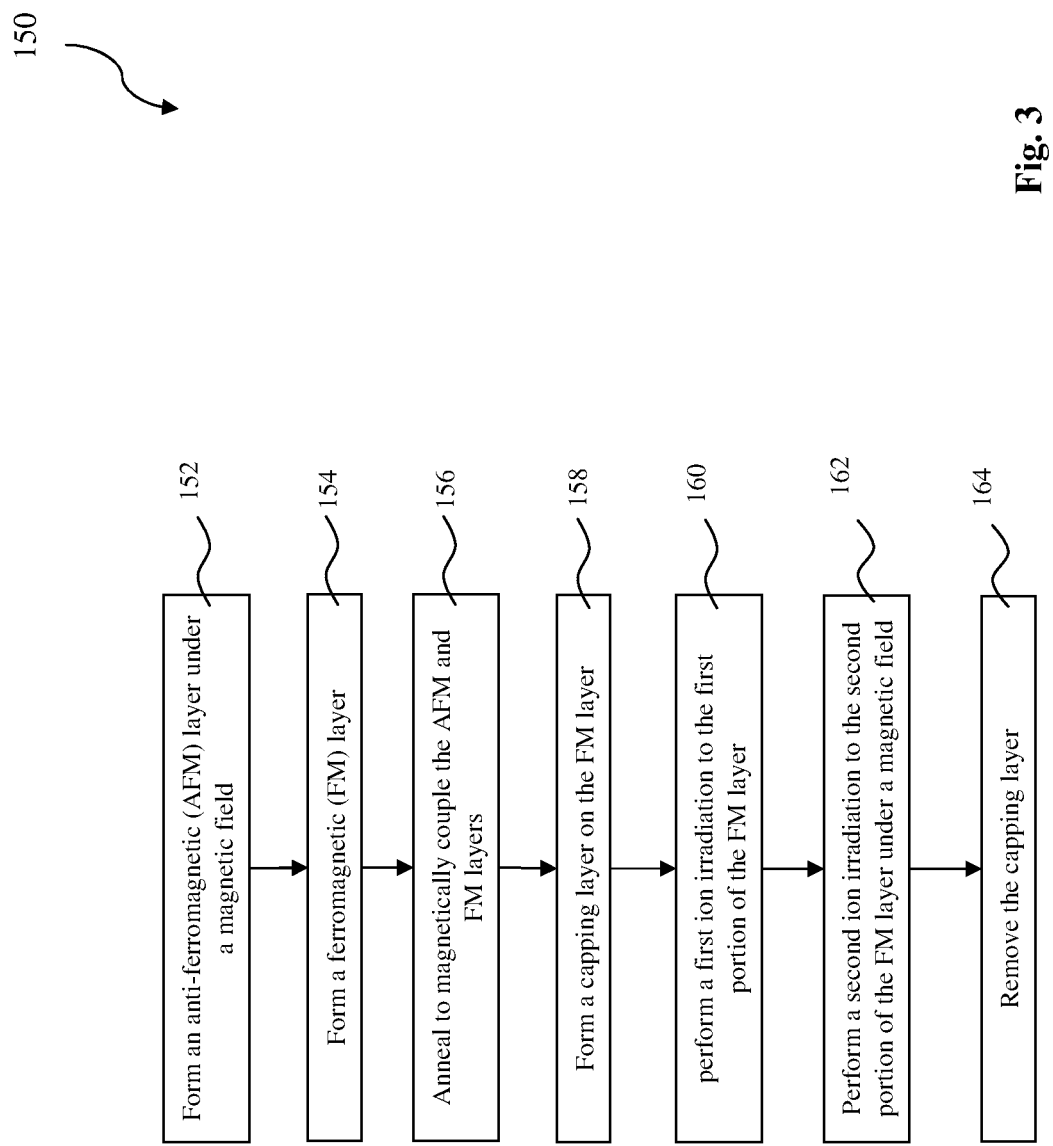
FIG. 3 is a flowchart of a method to form the modified free layer of FIG. 2a constructed according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a sectional view illustrating an embodiment of a semiconductor memory device 100 constructed according to aspects of the present disclosure. With reference to FIG. 1, the semiconductor memory device 100 and the method of making the same are collectively described. The semiconductor memory device 100 is a portion of one spin torque transfer magnetic random access memory (STT-MRAM). In one embodiment, the semiconductor memory device 100 includes a stack of material layers functioning as a magnetic tunnel junction (MTJ) and configured according to various aspects of the present disclosure in different embodiments.

The semiconductor memory device 100 is formed on a semiconductor substrate, such as silicon substrate or alternatively other suitable semiconductor substrate. The semiconductor memory device 100 includes a first electrode (or bottom electrode) 102 of conductive material. In one embodiment, the first electrode 102 includes tantalum. The first electrode 102 can be formed by a physical vapor deposition (PVD or sputtering) or alternatively other suitable processes.

The semiconductor memory device 100 includes a modified free layer 104 formed on the first electrode 102. In one embodiment, the modified free layer 104 includes ferromagnetic material. The modified free layer 104 includes a first portion 104a disposed in a first region 114 and magnetically free. The modified free layer 104 further includes additional portion(s) extended from the first portion 104a and magnetically pinned. In one embodiment, the modified free layer 104 includes a second portion 104b disposed in a second region 116 and a third portion 104c disposed in a third region 118. The second portion 104b is extended from the first portion 104a from one side and is magnetically pinned in a first direction. The third portion 104c is extended from the first portion 104a from another side and is magnetically pinned in a second direction opposite to the first direction. The first portion 104a is between the second portion 104b and third portion 104c as shown in FIG. 1. The three portions of the modified free layer 104 form a continuous ferromagnetic material layer.

The semiconductor memory device 100 includes a barrier layer 106 disposed on the first portion 104a of the modified free layer 104. The device 100 also includes a pinned layer (or fixed layer) 108 disposed on the barrier layer 106. The barrier layer 106 includes a dielectric material layer and is configured between the first portion 104a of the modified free layer 104 and the pinned layer 108 for tunneling effect. In one embodiment, the barrier layer 106 includes magnesium oxide (MgO). Alternatively, the barrier layer 106 may include aluminum oxide (AlO), aluminum nitride (AlN), aluminum oxynitride (AlON), or other suitable non-magnetic material. The barrier layer 106 is thin enough such that electrons can tunnel through the barrier layer when a bias voltage is applied. In one embodiment, the barrier layer 106 has a thickness ranging between about 5 angstrom and about 15 angstrom. In another embodiment, the barrier layer 106 has a thickness of about 10 angstrom. The barrier layer 106 may be formed by a PVD process. For example, a magnesium target is used in a sputtering chamber with an oxygen gas to form magnesium oxide. Alternatively, a magnesium film is formed first by sputtering and then converting it into the MgO film by applying an oxygen plasma.

The pinned layer 108 is adjacent the barrier layer 106 and is disposed within the first region 114. In one embodiment, the pinned layer 108 includes a ferromagnetic material layer. The ferromagnetic material can form permanent magnets and/or exhibit strong interactions with magnets. In one embodiment, the ferromagnetic layer 108 includes a cobaltiron-boron (CoFeB) film. In another embodiment, the ferromagnetic material layer 108 may additionally include other materials, such as Ta, Ru, or NiFe. In yet another embodiment, the ferromagnetic material layer may alternatively include other materials, such as CoFeTa, NiFe, Co, CoFe, CoPt, CoPd, FePt, or the alloy of Ni, Co and Fe. The pinned layer 108 may have a thickness ranging between about 15 angstrom and about 40 angstrom. In one example, the pinned layer 108 is formed by PVD, or alternatively another suitable process.

The semiconductor memory device 100 includes a pinning layer 110 configured adjacent the pinned layer 108 for pinning effect and is disposed within the first region 114. In one embodiment, the pining layer 110 includes an anti-ferromagnetic material. In the anti-ferromagnetic material, the magnetic moments of atoms or molecules align in a regular pattern with neighboring spins pointing in opposite directions. In one example, the pinning layer 110 includes platinum manganese (PtMn). In another example, the pinning layer 110 includes Iridium manganese (IrMn). In yet another example, the pinning layer 110 has a thickness ranging between about 100 angstrom and about 200 angstrom.

The semiconductor memory device 100 also includes a second electrode 112 formed on the pinning layer 110. In one embodiment, the second electrode 112 directly contacts the pinning layer 110. In another embodiment, the second electrode 112 includes tantalum. Alternatively, the second electrode 112 includes other suitable conductive material to electrically connect the device to other portions of the interconnect structure for pre-designed electrical routing. The second electrode 112 may be formed by a PVD process in one embodiment.

The first portion 104a of the modified free layer 104, the barrier layer 106, the pinned layer 108 and the pinning layer 110 are configured as a stack within the first region 114. The modified free layer 104, the barrier layer 106, the pinned layer 108 and the pinning layer 110 form a magnetic tunnel junction (MTJ). The modified free layer 104 is further described in detail with additional reference to FIGS. 2a through 2d.

FIG. 2a is a sectional view of the modified free layer 104 in one embodiment. The modified free layer 104 includes a ferromagnetic (FM) layer 120. The ferromagnetic layer 120 further includes a first, second and third portions 120a/120b/120c disposed in the first, second and third regions 114/116/118, respectively. The first portion 120a is not magnetically pinned, similar to the free layer in a conventional MTJ. The second and third portions 120b and 120c of the ferromagnetic layer 120 are magnetically pinned. In one embodiment, the second and third portions 120b and 120c are magnetically pinned in opposite directions. In another embodiment, the second and third portions 120b and 120c are magnetically pinned in horizontal directions (parallel with the substrate or the ferromagnetic layer 120). For example, the second portion 120b is magnetically pinned to x direction and the third portion 120c is magnetically pinned to −x direction, as illustrated in FIG. 2b. In yet another embodiment, the second and third portions 120b and 120c are magnetically pinned in vertical directions (perpendicular to the substrate or the ferromagnetic layer 120). For example, the second portion 120b is magnetically pinned to y direction and the third portion 120c is magnetically pinned to −y direction, as illustrated in FIG. 2c.

Referring back to FIG. 2a and further referring to FIG. 2d as a top view of the ferromagnetic layer 120, the ferromagnetic layer 120 is configured with geometric dimensions including a first dimension L in the x direction, a second dimension H in the y direction and a third dimension W in the z direction. In one embodiment, the ferromagnetic layer 120 is designed as a rectangle. In this case, the first dimension L is the length, the second dimension H is the height and the third dimension W is the width. In another embodiment, L is greater than W. In furtherance of the present embodiment, the ratio L:W ranges between about 2:1 and 4:1. The first, second and third portions of the ferromagnetic layer 120 each include a length L1, L2, and L3, respectively. In one embodiment, L2 and L3 are substantially the same. In another embodiment, L1 is about twice of L2 or L3. In furtherance of the present embodiment, L1:L2:L3 is about 2:1:1.

In one embodiment, the ferromagnetic layer 120 includes a cobalt-iron-boron (CoFeB) film. In another embodiment, the ferromagnetic material layer 120 may additionally include other materials, such as Ta, Ru, or NiFe. In yet another embodiment, the ferromagnetic material layer may alternatively include other materials, such as CoFeTa, NiFe, Co, CoFe, CoPt, CoPd, FePt, or the alloy of Ni, Co and Fe. The ferromagnetic layer 120 may have a thickness (or height) ranging between about 3 nanometer and about 5 nanometer. In one example, the ferromagnetic layer 120 is formed by a sputtering process (physical vapor deposition or PVD), or alternatively other suitable process.

Still referring to FIG. 2a, the modified free layer 104 further includes an anti-ferromagnetic (AFM) layer 122 configured and processed to provide proper magnetic pinning function to the ferromagnetic layer 120. The anti-ferromagnetic layer 122 is configured adjacent the ferromagnetic layer 120. In one embodiment, the anti-ferromagnetic layer 122 includes platinum manganese (PtMn). In another embodiment, the anti-ferromagnetic layer 122 includes Iridium manganese (IrMn). In yet another embodiment, the ferromagnetic layer 122 has a thickness ranging between about 60 angstrom and about 120 angstrom. Similarly, the anti-ferromagnetic layer 122 includes a substantial similar geometry in the top view. For example, the anti-ferromagnetic layer 122 has a rectangle shape in the top view. For another example, the anti-ferromagnetic layer 122 includes three portions 122a, 122b and 122c disposed in the regions 114, 116 and 118, respectively. The modified free layer 104 is formed in a procedure such that the first portion 120a of the ferromagnetic layer 120 is magnetically free. The second and third portions 120b and 120c of the ferromagnetic layer 120 are magnetically pinned in the opposite directions. Therefore, domain walls are formed between the interfaces between the free portion 120a and the pinned portions 120b/120c. The domain walls reduce the switch current of the MRAM device and enhance the MRAM performance.

Figure 4:
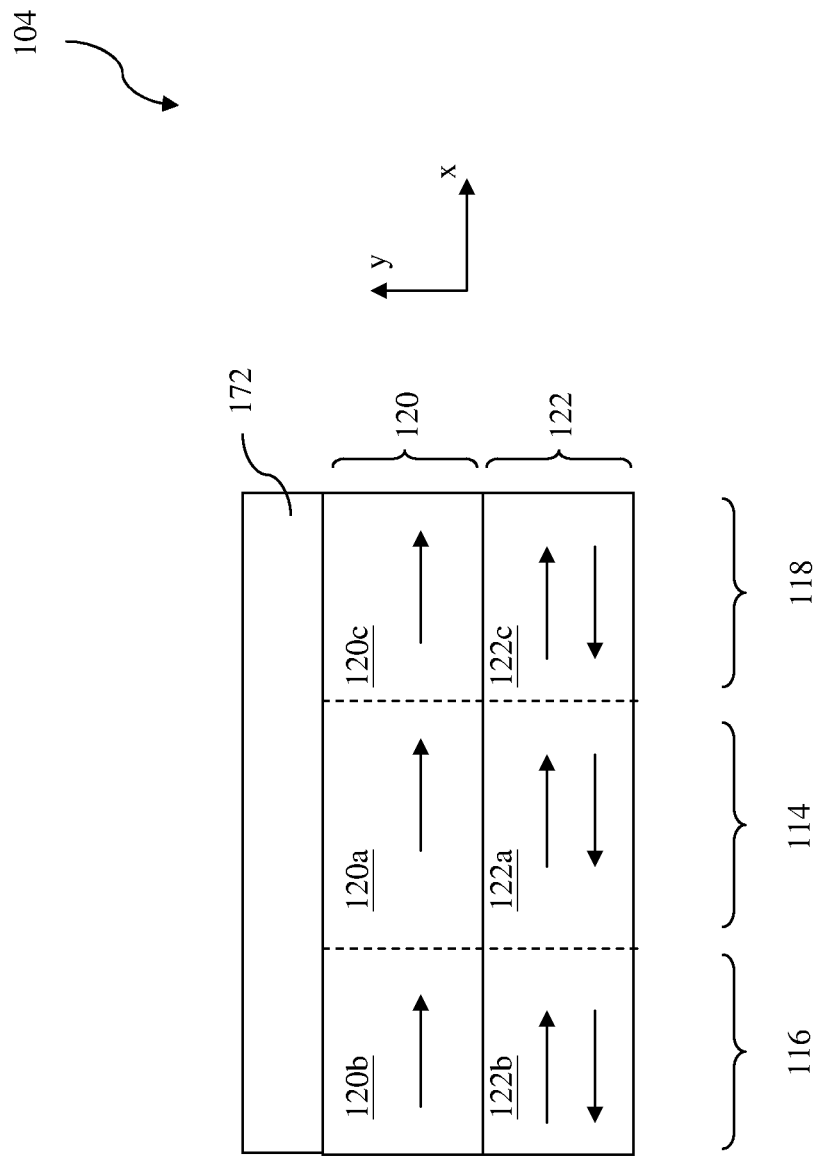
FIGS. 4 through 6 are sectional views illustrating the modified free layer at various manufacturing stages of FIG. 3.
Figure 5:
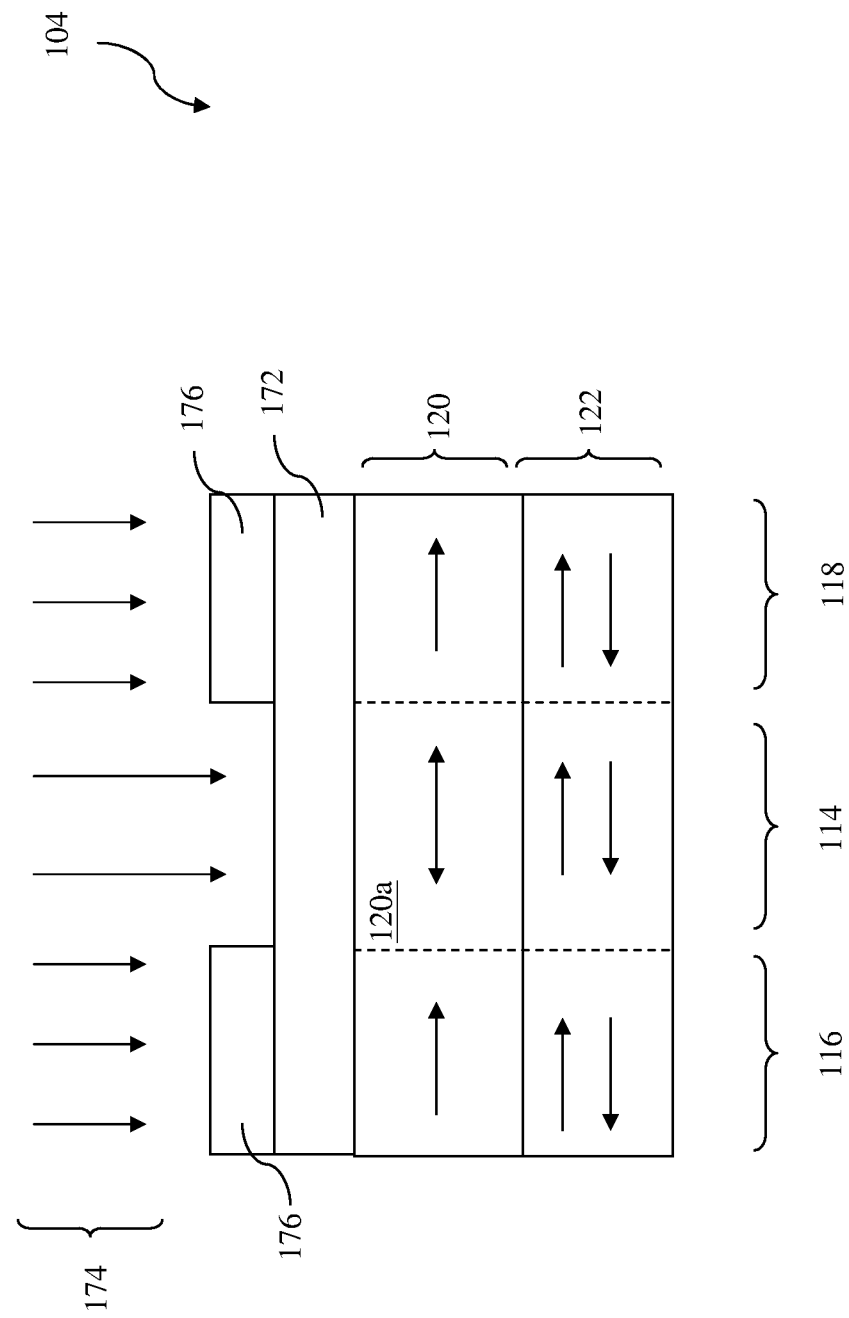
Figure 6:
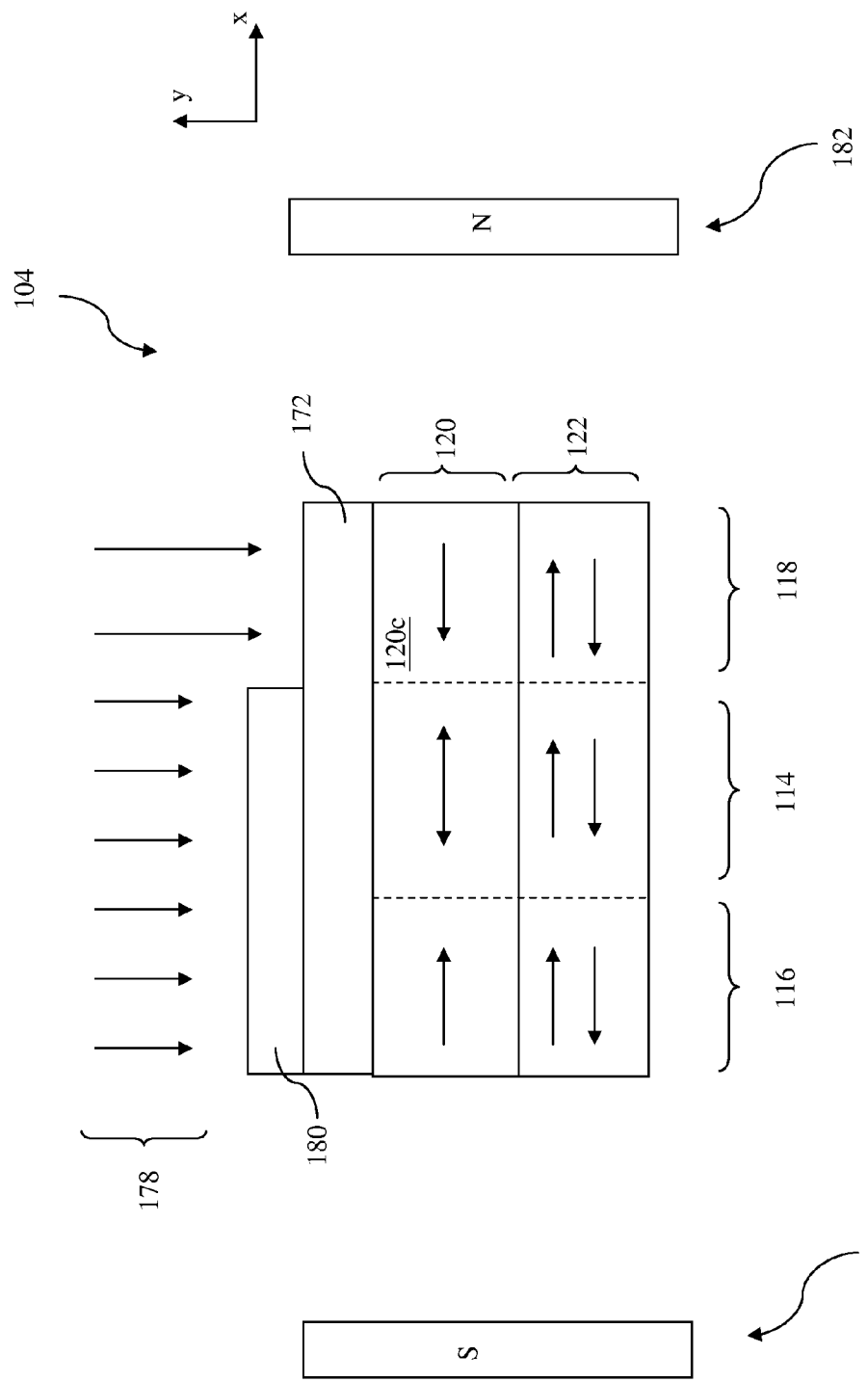

A method 150 of forming the modified free layer 104 is described in one embodiment with reference to FIGS. 3 through 6. FIG. 3 is a flowchart of the method 150 of forming the modified free layer 104. FIGS. 4-6 are sectional views of the modified free layer 104 at various manufacturing stages according to various aspects of the present disclosure.

Referring to FIGS. 3 and 4, the method 150 begins at step 152 by forming the AFM layer 122 on a semiconductor substrate. A magnetic filed may be applied to the AFM layer 122 during this processing step. The magnetic field is designed and configured such that the AFM layer 122 is magnetically oriented. In one example, the AFM layer 122 is oriented horizontally by the magnetic field. Alternatively, the AFM layer 122 is oriented vertically by the magnetic field. In one embodiment, the AFM layer 122 is formed by a sputtering process. Particularly, the semiconductor substrate includes the first electrode 102 previously formed thereon. In furtherance of the present embodiment, the AFM layer 122 is formed on the first electrode 102.

Still referring to FIGS. 3 and 4, the method 150 proceeds to step 154 by forming the FM layer 120 on the AFM layer 122. In one embodiment, the FM layer 120 is formed by another sputtering process. The ferromagnetic layer 120 includes a cobalt-iron-boron (CoFeB) film or additionally include other materials, such as Ta, Ru, or NiFe. The ferromagnetic layer 120 may have a thickness ranging between about 3 nanometer and about 5 nanometer.

The formation of the AFM layer 122 and the FM layer 120 further includes one or more patterning processes to define the AFM layer 122 and the FM layer 120 with proper geometry and dimensions. In one embodiment, after the depositions of the AFM and FM layers 122 and 120, a patterned photoresist layer is formed on the AFM and FM layers by a photolithography process. The patterned photoresist layer includes one or more openings to expose the AFM and FM layers 122/120 in the areas where the AFM and FM layers 122/120 are to be removed. The AFM and FM layers 122/120 in the openings are then removed by an etching process using the patterned photoresist layer as an etching mask.

Still referring to FIGS. 3 and 4, the method 150 proceeds to step 156 by performing an annealing process to the FM layer 120 to magnetically couple the FM layer 120 with the AFM layer 122. In one example, the annealing temperature is about 300 C. In the present embodiment, the FM layer 120 is magnetically oriented in the x direction after the annealing. In another embodiment, a magnetic field may be applied to the FM layer 120 for the proper magnetic coupling during the annealing process.

Still referring to FIGS. 3 and 4, the method 150 proceeds to step 158 by forming a capping layer 172 on the FM layer 120. The capping layer 172 includes tantalum (Ta), ruthenium (Ru), aluminum oxide (AlO) or other suitable material. In one embodiment, the capping layer 172 has a thickness ranging between about 5 angstrom and about 30 angstrom. In another embodiment, the capping layer 172 is formed by a sputtering process. Alternatively, the capping layer 172 may be formed before the annealing process at step 156. The capping layer 172 functions as a protection layer for subsequent ion implantations.

Referring to FIGS. 3 and 5, the method 150 proceeds to step 160 by performing a first ion irradiation 174 to the first portion 120a of the FM layer 120 in the first region 114. The first ion irradiation 174 is implemented to magnetically decouple the first portion 120a of the FM layer 120 from the AFM layer 122, such that the first portion 120a of the FM layer 120 is magnetically free. The first ion irradiation 174 can achieve a decoupling effect in a local area. Particularly, a patterned photoresist layer 176 is formed on the FM layer 120 by a photolithography process. The patterned photoresist layer 176 includes an opening aligned with the first region 114 such that the capping layer within the first region 114 is exposed. The first ion irradiation 174 is applied to the FM layer 120 within the first region 114 using the patterned photoresist layer 176 as an ion irradiation mask. During the process of the first ion irradiation 174, no external magnetic field is applied to the FM layer 120.

In one embodiment, the first ion irradiation 174 includes an ion species of copper (Cu). The first ion irradiation 174 may alternatively use other nonmagnetic or weak magnetic material without changing the magnetic structure of the AFM layer 122. In another embodiment of the first ion irradiation 174, the ion species (such as Cu) transfers most of its energy to the FM layer 120 and may stop in the AFM layer 122. In yet another embodiment, the first ion irradiation 174 includes an ion dose ranging between about $1 \times 10^{14}$ ions/cm$^2$ and about $10 \times 10^{14}$ ions/cm$^2$. In yet another embodiment, the first ion irradiation 174 includes an ion energy ranging between about 30 KeV and about 100 KeV.

Thereafter, the patterned photoresist layer 176 is removed by a process such as wet stripping or plasma ashing. In one embodiment, other dielectric materials may be alternatively used as the ion irradiation mask. In this case, the ion irradiation mask is first patterned using a photolithography process.

Referring to FIGS. 3 and 6, the method 150 proceeds to step 162 by performing a second ion irradiation 178 to one of the second portion 120b and third portion 120c of the FM layer 120 to change the magnetic orientation of the corresponding portion such that the second and third portions of the FM layer 120 are magnetically pinned in the opposite directions. In the present embodiment, the second ion irradiation 178 is applied to the third portion 120c of the FM layer 120 such that the magnetic orientation of the third portion 120c is changed to the opposite direction. For example, the magnetic direction is switched to the −x direction.

The second ion irradiation 178 changes the magnetic direction of the third portion 120c within the third region 118. Particularly, a patterned photoresist layer 180 is formed on the FM layer 120 by a photolithography process. The patterned photoresist layer 180 includes an opening aligned with the third region 118 such that the capping layer within the third region 118 is exposed. The second ion irradiation 178 is applied to the FM layer 120 within the third region 118 using the patterned photoresist layer 180 as an ion irradiation mask. During the second ion irradiation 174, an external magnetic field is applied to the FM layer 120 by a magnetic mechanism 182. The magnetic mechanism 182 is properly designed and configured such that the corresponding magnetic field is in the proper direction and has enough strength to switch the magnetic direction of the third portion 120c of the FM layer 120. In one embodiment, the magnetic field generated by the magnetic mechanism 182 is greater than about 50 Tesla.

In terms of ion species and dose, the second ion irradiation 178 is substantially similar to the first ion irradiation 174. In one example, the second ion irradiation 178 includes Cu as an ion species. The second ion irradiation 178 may alternatively use other nonmagnetic or weak magnetic materials without changing the magnetic structure of the AFM layer 122. In another embodiment of the second ion irradiation 178, the ion species (such as Cu) transfers most of its energy to the FM layer 120 and may stop in the AFM layer 122. In yet another embodiment, the second ion irradiation 178 includes an ion dose ranging between about $1 \times 10^{14}$ ions/cm$^2$ and about $10 \times 10^{14}$ ions/cm$^2$. In yet another embodiment, the second ion irradiation 178 includes an ion energy ranging between about 30 KeV and about 100 KeV.

Thereafter, the patterned photoresist layer 180 is removed by a process such as wet stripping or plasma ashing. In one embodiment, other dielectric materials may be alternatively used as the ion irradiation hard mask. In this case, the ion irradiation mask is first patterned using a photolithography process. The hard mask is removed afterward by an etching process.

The method 150 may proceed to step 164 by removing the capping layer 172 using an etching process or other suitable method. In an alternative method, the barrier layer 106 of the MTJ in FIG. 1 may function as the capping layer. In this case, the capping layer 172 will remain after the first and second ion irradiations to further function as the barrier layer of the MTJ.

Other processing steps may follow to form the MTJ. For example, the barrier layer 106 is formed on the FM layer 120. The pinned layer 108 is formed on the barrier layer 106. Then the pinning layer 110 is formed on the pinned layer 108. The second electrode 112 may be further formed on the pinning layer 110. The barrier layer 106, the pinned layer 108 and the pinning layer 110 are formed within the first region 114.

Figure 7:
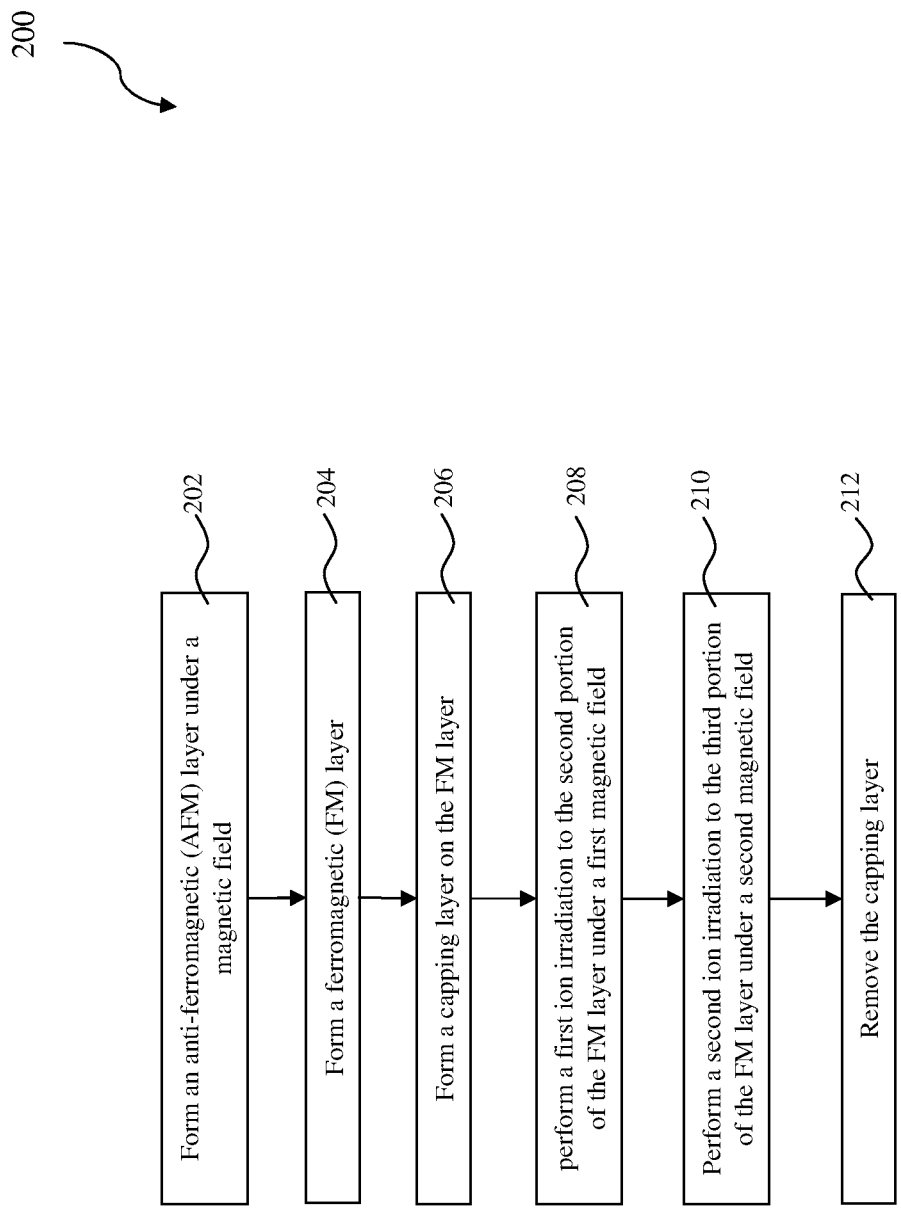
FIG. 7 is a flowchart of a method to form the modified free layer of FIG. 2a in another embodiment constructed according to aspects of the present disclosure.
Figure 8:
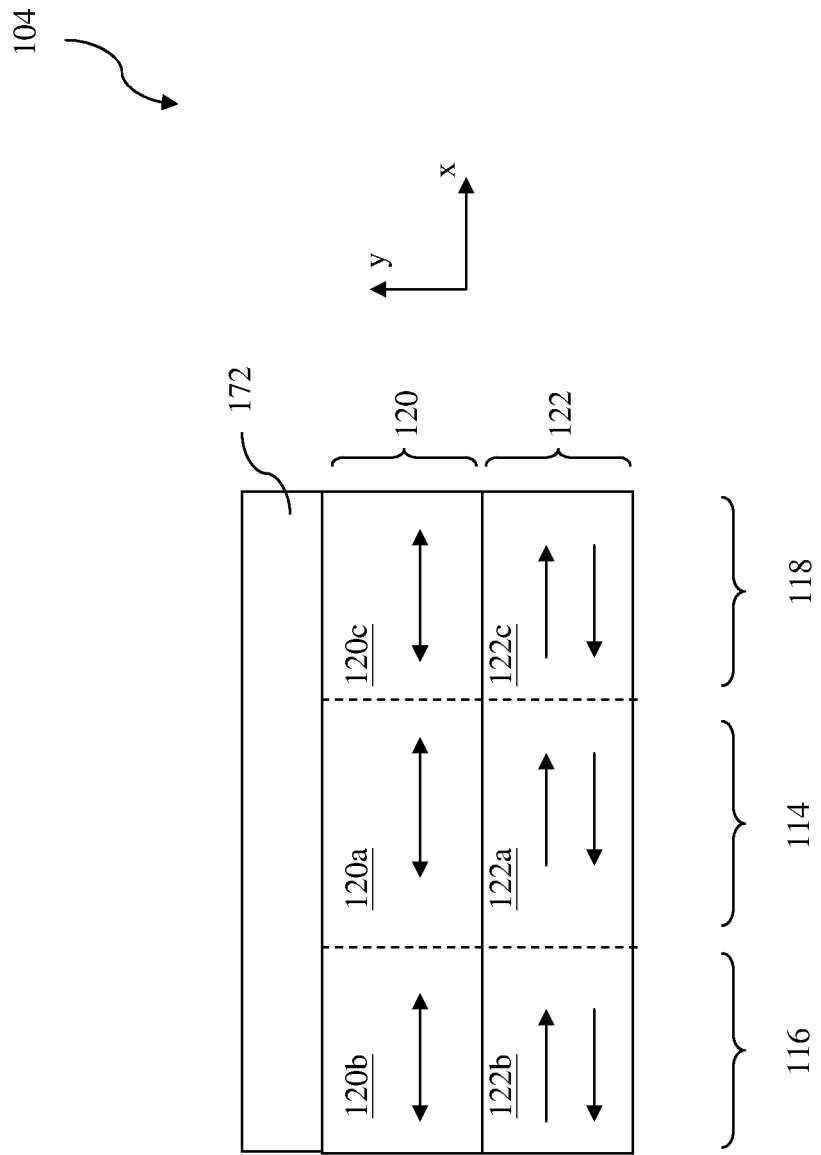
FIGS. 8 through 10 are sectional views illustrating the modified free layer at various manufacturing stages of FIG. 7.
Figure 9:
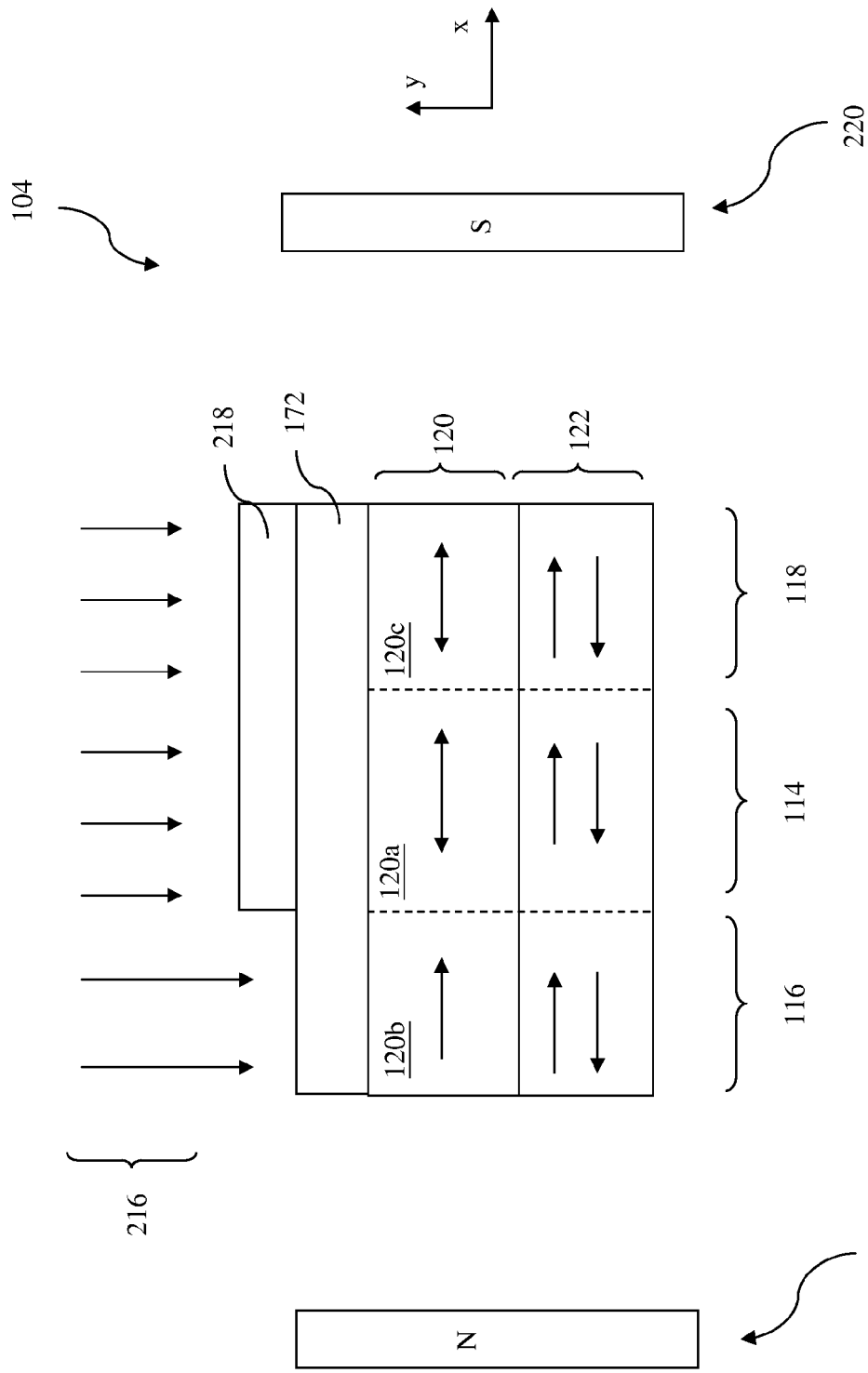
Figure 10:
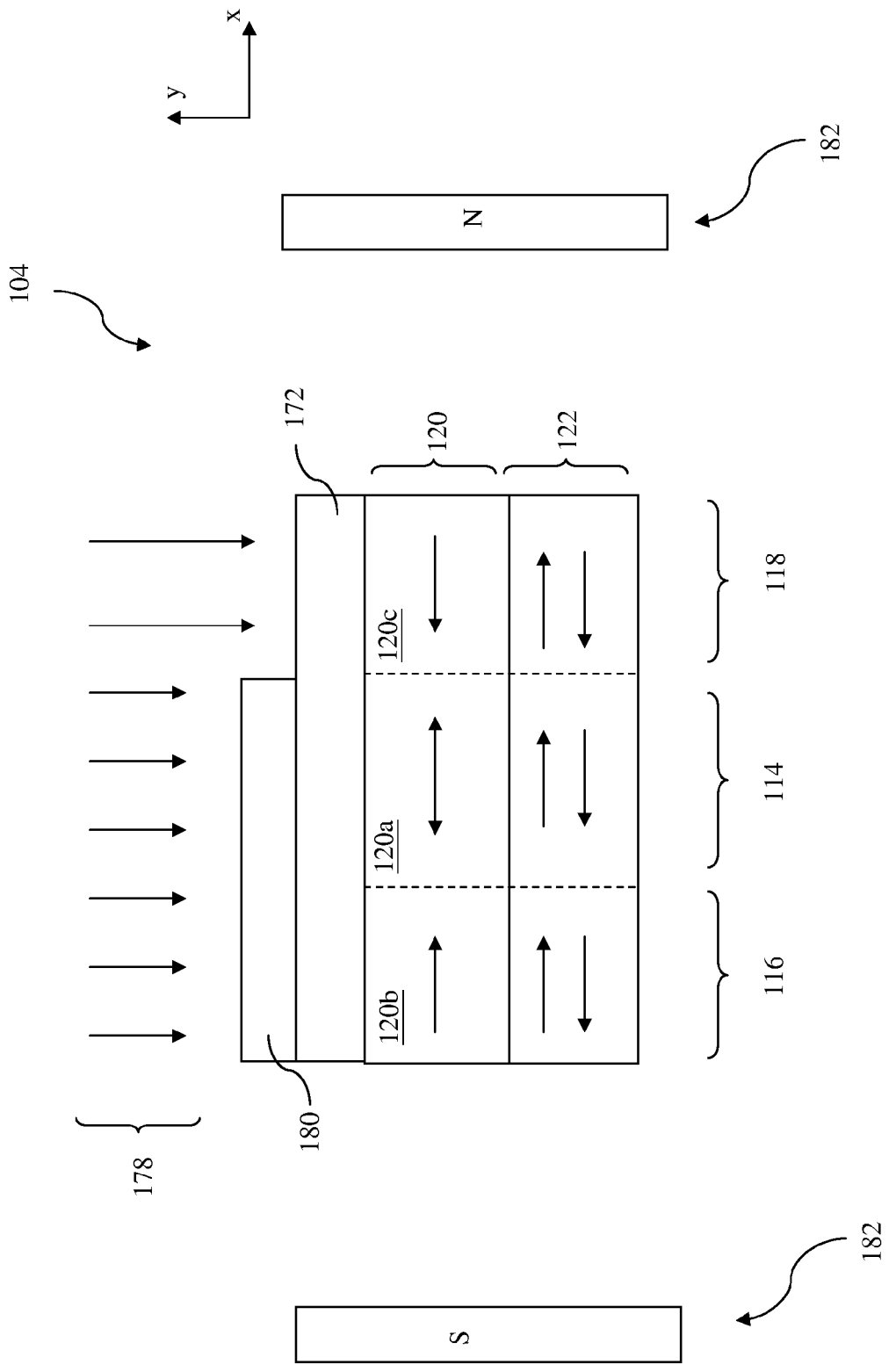

A method 200 of forming the modified free layer 104 is described in another embodiment with reference to FIGS. 7 through 10. FIG. 7 is a flowchart of the method 200 to form the modified free layer 104. FIGS. 8 through 10 are sectional views of the modified free layer 104 at various manufacturing stages according to various aspects of the present embodiment.

Referring to FIGS. 7 and 8, the method 200 begins at step 202 by forming the anti-ferromagnetic (AFM) layer 122 on a semiconductor substrate (not shown). A magnetic filed may be applied to the AFM layer 122 during this processing step. The magnetic field is designed and configured such that the AFM layer 122 is magnetically oriented. In one example, the AFM layer 122 is oriented horizontally by the magnetic field. Alternatively, the AFM layer 122 is oriented vertically by the magnetic field. In one embodiment, the AFM layer 122 is formed by a sputtering process. Particularly, the semiconductor substrate includes the first electrode 102 formed previously. The AFM layer 122 is formed on the first electrode 102.

Still referring to FIGS. 7 and 8, the method 200 proceeds to step 204 by forming the ferromagnetic (FM) layer 120 on the AFM layer 122. In one embodiment, the FM layer 120 is formed by another sputtering process. The ferromagnetic layer 120 includes a cobalt-iron-boron (CoFeB) film or additionally include other materials, such as Ta, Ru, or NiFe. The ferromagnetic layer 120 may have a thickness ranging between about 3 nanometers and about 5 nanometers.

The formation of the AFM layer 122 and the FM layer 120 further includes one or more patterning processes to define the AFM layer 122 and the FM layer 120 with proper geometry and dimensions. In one embodiment, after the depositions of the AFM and FM layers 122/120, a patterned photoresist layer is formed on the AFM and FM layers 122/120 by a photolithography process. The patterned photoresist layer includes one or more openings to expose the AFM and FM layers 122/120 in the areas where the AFM and FM layers 122/120 are to be removed. The AFM and FM layers 122/120 in the openings are then removed by an etching process using the patterned photoresist layer as an etching mask.

Still referring to FIGS. 7 and 8, the method 200 proceeds to step 206 by forming a capping layer 172 on the FM layer 120. The capping layer 172 includes tantalum (Ta), ruthenium (Ru), aluminum oxide (AlO) or other suitable materials. In one embodiment, the capping layer 172 has a thickness ranging between about 5 angstrom and about 30 angstrom. In another embodiment, the capping layer 172 is formed by a sputtering process. The capping layer 172 function as a protection layer for subsequent ion implantations. Particularly, there is no annealing process implemented between the step 204 to form the FM layer 120 and the step 206 to form the capping layer 172. Thus, the first portion 120a of the FM layer 120 is magnetically free.

Referring to FIGS. 7 and 9, the method 200 proceeds to step 208 by performing a first ion irradiation 216 to the second portion 120b of the FM layer 120 in the second region 116. The first ion irradiation 216 is implemented to change the magnetic orientation of the second portion 120b such that the second portion 120b of the FM layer 120 is magnetically pinned in a certain direction. In the present embodiment, the first ion irradiation 216 is applied to the second portion 120b of the FM layer 120 such that the magnetic orientation of the second portion 120b is changed to the x direction.

The first ion irradiation 216 changes the magnetic direction of the second portion 120b within the second region 116. Particularly, a patterned photoresist layer 218 is formed on the FM layer 120 by a photolithography process. The patterned photoresist layer 218 includes an opening aligned with the second region 116 such that the capping layer within the second region 116 is exposed. The first ion irradiation 216 is applied to the FM layer 120 within the second region 116 using the patterned photoresist layer 218 as an ion irradiation mask. During the first ion irradiation 216, an external magnetic field is applied to the FM layer 120 by a magnetic mechanism 220. The magnetic mechanism 220 is properly designed and configured such that the corresponding magnetic field is in the proper direction and has enough strength to change the magnetic direction of the second portion 120b of the FM layer 120. In one embodiment, the magnetic field generated by the magnetic mechanism 220 is greater than about 50 Tesla.

In another embodiment, the first ion irradiation 216 includes an ion species of Cu. The first ion irradiation 216 may alternatively use other nonmagnetic or weak magnetic materials without changing the magnetic structure of the AFM layer 122. In yet another embodiment of the first ion irradiation 216, the ion species (such as Cu) transfers most of its energy to the FM layer 120 and may stop in the AFM layer 122. In yet another embodiment, the first ion irradiation 216 includes an ion dose ranging between about $1 \times 10^{14}$ ions/cm$^2$ and about $10 \times 10^{14}$ ions/cm$^2$. In yet another embodiment, the first ion irradiation 216 includes an ion energy ranging between about 30 KeV and about 100 KeV.

Thereafter, the patterned photoresist layer 218 is removed by a process such as wet stripping or plasma ashing. In one embodiment, other dielectric materials may be alternatively used as the ion irradiation mask. In this case, the ion irradiation mask is first patterned using a photolithography process.

Referring to FIGS. 7 and 10, the method 200 proceeds to step 210 by performing a second ion irradiation 178 to the third portion 120c of the FM layer 120 to change its magnetic orientation such that the third portion 120c of the FM layer 120 is magnetically pinned in the direction opposite to the magnetic direction of the second portion 120b. In the present embodiment, the second ion irradiation 178 is applied to the third portion 120c of the FM layer 120 such that the magnetic orientation of the third portion 120c is changed to the −x direction.

The second ion irradiation 178 changes the magnetic direction of the third portion 120c within the third region 118. Particularly, a patterned photoresist layer 180 is formed on the FM layer 120 by a photolithography process. The patterned photoresist layer 180 includes an opening aligned with the third region 118 such that the capping layer within the third region 118 is exposed. The second ion irradiation 178 is applied to the FM layer 120 within the third region 118 using the patterned photoresist layer 180 as an ion irradiation mask. During the second ion irradiation 174, an external magnetic field is applied to the FM layer 120 by a magnetic mechanism 182. The magnetic mechanism 182 is properly designed and configured such that the corresponding magnetic field is in the proper direction and has an enough strength to switch the magnetic direction of the third portion 120c of the FM layer 120. In one embodiment, the magnetic field generated by the magnetic mechanism 182 is greater than about 50 Tesla.

In terms of ion species and dose, the second ion irradiation 178 is substantially similar to the first ion irradiation 216. In one example, the second ion irradiation 178 includes Cu as an ion species. The second ion irradiation 178 may alternatively use other nonmagnetic or weak magnetic materials without changing the magnetic structure of the AFM layer 122. In another embodiment of the second ion irradiation 178, the ion species (such as Cu) transfers most of its energy to the FM layer 120 and may stop in the AFM layer 122. In yet another embodiment, the second ion irradiation 178 includes an ion dose ranging between about $1\times10^{14}$ ions/cm$^2$ and about $10\times10^{14}$ ions/cm$^2$. In yet another embodiment, the second ion irradiation 178 includes an ion energy ranging between about 30 KeV and about 100 KeV.

Thereafter, the patterned photoresist layer 180 is removed by a process such as wet stripping or plasma ashing. In one embodiment, other dielectric materials may be alternatively used as the ion irradiation hard mask. In this case, the ion irradiation mask is first patterned using a photolithography process. The hard mask is removed afterward by an etching process.

The method 200 may proceed to step 212 by removing the capping layer 172 using an etching process or other suitable method. In an alternative method, the barrier layer 106 of the MTJ in FIG. 1 may function as the capping layer. In this case, the capping layer 172 will remain after the first and second ion irradiations to further function as the barrier layer of the MTJ.

Figure 11:
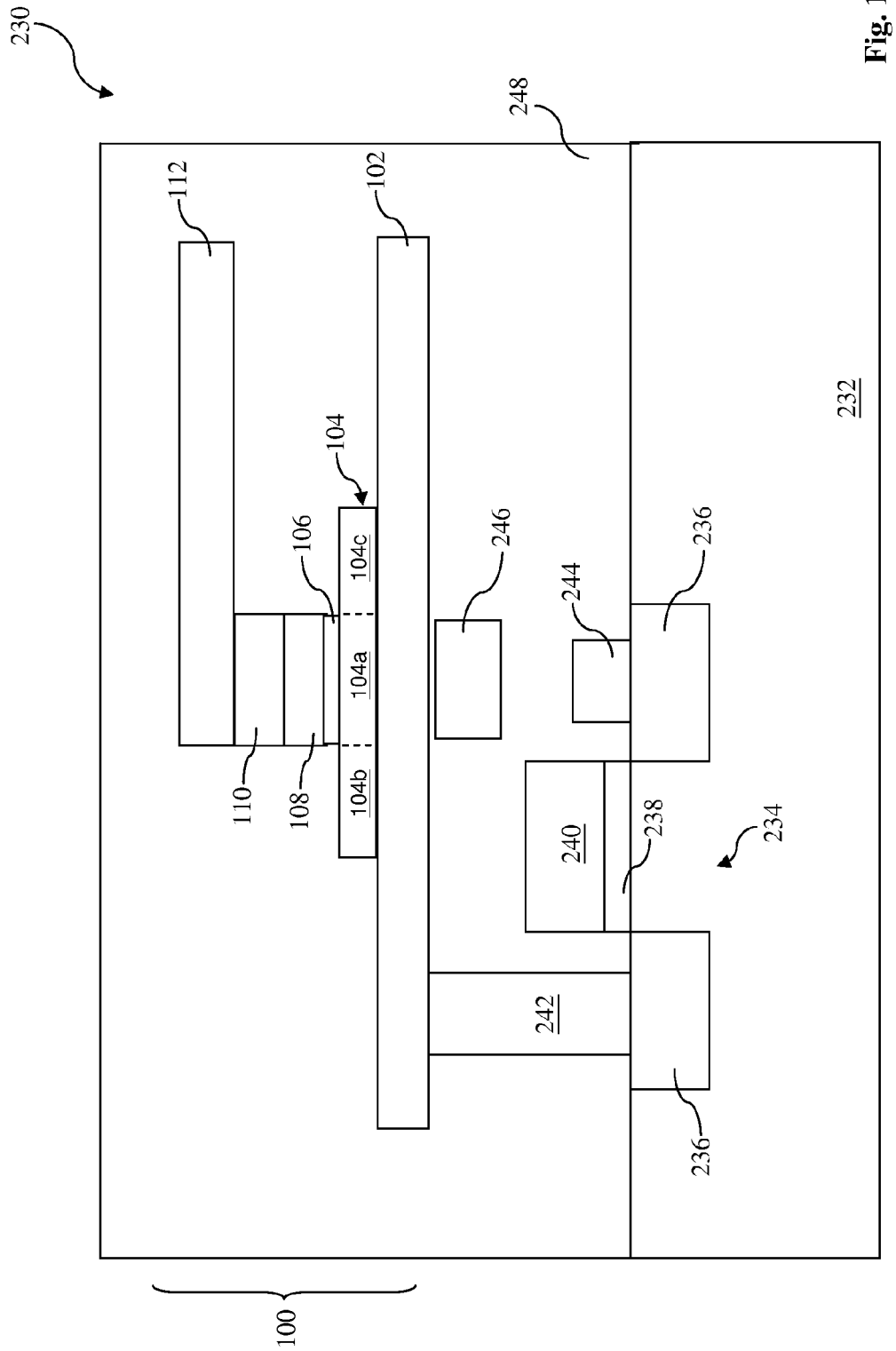
FIG. 11 is a sectional view illustrating an integrated circuit constructed according to aspects of the present disclosure.

FIG. 11 is a sectional view illustrating one embodiment of an integrated circuit constructed according to aspects of the present disclosure. The semiconductor memory device 100 FIG. 1 is implemented in the integrated circuit 230. The integrated circuit 230 and the method of making the same are collectively described with reference to FIG. 11 and additionally to FIGS. 1 through 2d. The integrated circuit 230 includes a silicon substrate 232. In other embodiments, the substrate 232 may alternatively or additionally include other semiconductor material such as germanium, gallium arsenic and diamond. The substrate 232 further includes various doped features, such as n-type wells and/or p-type wells, formed by ion implantation or diffusion. The substrate 230 also includes various isolation features, such as shallow trench isolation (STI), formed by a process known in the art, such as a process including etching to form various trenches and then deposition to fill the trench with a dielectric material using chemical vapor deposition (CVD).

The integrated circuit 230 further includes an exemplary metal-oxide-silicon (MOS) transistor 234. The MOS transistor 234 includes source and drain regions 236 formed by a process, such as ion implantation. The MOS transistor 234 further includes a gate stack interposed between the source and drain 236. The gate stack includes a gate dielectric 238 disposed on the substrate and a gate electrode 240 disposed on the gate dielectric 238. The gate dielectric 238 includes one or more dielectric films vertically interposed between the gate electrode and the substrate. In one example, the gate dielectric 238 includes a silicon oxide film formed by a thermal oxidation. In another example, the gate dielectric 238 includes a high-k film and may additionally include a thermal silicon oxide. The high-k film is a dielectric material having a dielectric constant greater than that of the silicon oxide. The high-k film, such as hafnium oxide, can be formed by a process such as atomic layer deposition (ALD), or other suitable method. The gate electrode 240 includes one or more conductive materials, such as doped polysilicon, metal, metal alloy, or combinations thereof. The gate electrode 240 can be formed by CVD, PVD or other suitable method. In another embodiment, spacers may be formed adjacent the gate electrodes.

The integrated circuit 230 also includes interconnects on the substrate. The interconnects are designed for electrical connection and routing to enable the integrated circuit to function according to its design. In one example, the interconnects are extended to and electrically connected to the exemplary MOS transistor 234. The interconnects include various conductive features formed in dielectric material 248 for proper isolation. The various conductive features include contacts, metal one (e.g., M1) lines, vias, and high level metal lines. The various conductive features may include copper, tungsten, titanium, titanium nitride, gold, aluminum, alloy, carbon nano-tubes, and/or other suitable materials, and may be formed by CVD, PVD, plating and/or other processes. The interconnects may have a homogenous or heterogeneous structure. For example, each conductive feature includes a lining layer possibly having titanium, titanium nitride, tantalum or tantalum nitride; and a bulk conductive layer having copper, tungsten, aluminum, or aluminum alloy. In another example, the conductive features are formed in a damascene process, including trench etch, deposition and chemical mechanical polishing (CMP).

In the present embodiment, the interconnects include first, second and third conductive features 242, 244 and 246. In furtherance of the present embodiment, the first conductive feature 242 lands on one of the source/drain regions 236 and is electrically coupled to a magnetic tunnel junction (MTJ) 100. The second conductive feature 244 is a contact landed on another one of the source/drain regions 236. The third conductive feature 246 is configured adjacent the MTJ but is not electrically connected to the MTJ 100.

The integrated circuit 230 also includes the MTJ 100 as illustrated in FIG. 11. The MTJ 100 is coupled to various features, such as the MOS transistor 234, through the interconnects. In one embodiment, the MTJ 100 is the memory device 100 of FIG. 1. For example, the MTJ 100 includes the modified free layer 104 formed on the first electrode 102. The MTJ 100 further includes the barrier layer 106 formed on the modified free layer 104; the pinned layer 108 on the barrier layer 106; and the pinning layer 110 on the pinned layer 108. The MTJ 100 further includes the second electrode 112 formed on the pinning layer 110. The barrier layer 106, the pinned layer 1008 and the pinning layer 110 form a stack landing on a central portion 104a of the modified free layer 104. The modified free layer 104 includes the central portion 104a that is magnetically free, and further includes the second portion 104b extended from one side of the central portion 104a and the third portion 104c extended from the opposite side of the central portion 104a.

In one embodiment, the modified free layer 104 is the modified free layer 104 of FIG. 2a. Particularly, with further reference to FIGS. 2a through 2d, the modified free layer 104 includes the AFM layer 122 and the FM layer 120 formed on the AFM layer 122. The AFM layer 122 is configured to magnetically coupled to the FM layer 120. Correspondingly, the FM layer 120 includes the central portion (first portion) 120a and the lateral portions (the second and third portions) 120b and 120c. The central portion 120a is magnetically free. The second and third portions 120b and 120c are magnetically pinned in the opposite directions. In one embodiment, the second portion 120b and the third portion 120c are magnetically pinned in the opposite horizontal directions. In another embodiment, the second portion 120b and the third portion 120c are magnetically pinned in the opposite vertical directions. The stack of the barrier layer 106, the pinned layer 108 and the pinning layer 110 is aligned and formed on the central portion 120a of the FM layer 120.

Other features may be further included in the integrated circuit 230 and various processes can be implemented to form the other features. In one embodiment, the modified free layer 104 is formed by the method 150 of FIG. 3. In another embodiment, the modified free layer 104 is formed by the method 200 of FIG. 7. In the present embodiment, the MTJ 100 and the MOS transistor 234 are configured to form a random access memory (RAM) device, also referred to as spin-torque transfer magnetic RAM (STT-MRAM) device.

In one embodiment, the memory device 230 implements the writing through a magnetic field using the conductive feature 246 as a write line. The gate electrode 240 is a read line. In yet another embodiment, a plurality of STT-MRAM devices are incorporated in the integrated circuit 230 and configured in an array to enable large volume data access. By implementing the disclosed structure and the method in one or more embodiments, the domain walls are formed in the interfaces between the central portion and the lateral portions of the FM layer 120. In one example, the writing current is reduced without degrading MR and/or thermal stability.

Thus, the present disclosure provides a semiconductor memory device. The semiconductor memory device includes a first ferromagnetic layer magnetically pinned and positioned within a first region of a substrate; a second ferromagnetic layer proximate the first ferromagnetic layer; and a barrier layer interposed between the first ferromagnetic layer and the first portion of the second ferromagnetic layer. The second ferromagnetic layer includes a first portion being magnetically free and positioned within the first region; a second portion magnetically pinned to a first direction and positioned within a second region of the substrate, the second region contacting the first region from a first side; and a third portion magnetically pinned to a second direction and positioned within a third region of the substrate, the third region contacting the first region from a second side.

The present disclosure also provides one embodiment of a method to form a semiconductor device. The method includes forming an anti-ferromagnetic layer on a substrate; forming a ferromagnetic layer on the anti-ferromagnetic layer; performing a first ion irradiation to only one portion of the ferromagnetic layer; and performing a second ion irradiation to only another portion of the ferromagnetic layer. The ferromagnetic layer includes a first, second and third portions; and the second portion is located between the first and third portions.

The present disclosure also provides another embodiment of a semiconductor memory device. The semiconductor memory device includes an anti-ferromagnetic layer formed over a semiconductor substrate and disposed within a first region of the semiconductor substrate; a pinned ferromagnetic layer adjacent the anti-ferromagnetic layer, pinned by the anti-ferromagnetic layer, and disposed within the first region; a free ferromagnetic layer approximate the pinned ferromagnetic layer and disposed within the first region; a dielectric barrier layer interposed between the pinned ferromagnetic layer and the free ferromagnetic layer for tunneling effect; and an extended ferromagnetic layer extended from the free ferromagnetic layer, pinned by an additional anti-ferromagnetic feature, and disposed within a second region of the semiconductor substrate, the second region contacting the first region.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor memory device, comprising:
a first ferromagnetic layer magnetically pinned and positioned within a first region of a substrate;
a second ferromagnetic layer proximate the first ferromagnetic layer, wherein the second ferromagnetic layer includes
a first portion being magnetically free and positioned within the first region;
a second portion magnetically pinned to a first direction and positioned within a second region of the substrate, the second region contacting the first region from a first side; and
a third portion magnetically pinned to a second direction and positioned within a third region of the substrate, the third region contacting the first region from a second side;
a barrier layer interposed between the first ferromagnetic layer and the first portion of the second ferromagnetic layer;
an electrode extending under and interfacing with each of the first, second, and third portions of the second ferromagnetic layer; and
a transistor connected to the second ferromagnetic layer by a conductive feature interfacing with the electrode.

2. The semiconductor memory device of claim 1, wherein the first and second directions are opposite from each other.

3. The semiconductor memory device of claim 1, wherein the first and second directions are perpendicular to the substrate.

4. The semiconductor memory device of claim 1, wherein the first and second directions are parallel to the substrate.

5. The semiconductor memory device of claim 1, further comprising a first anti-ferromagnetic layer adjacent the first ferromagnetic layer and configured for pinning the first ferromagnetic layer.

6. The semiconductor memory device of claim 5, further comprising a second anti-ferromagnetic layer adjacent the second ferromagnetic layer and configured for pinning the first portion of the second ferromagnetic layer.

7. The semiconductor memory device of claim 1, wherein
the first portion spans in a first direction from the first side to the second side;
the second portion spans in a second direction from the first side to a farthest side of the second portion; and
the third portion spans in a third direction from the second side to a farthest side of the third portion, wherein the spans in the second and third directions are substantially equal, and the span in the first direction is about twice that of the second direction.

8. The semiconductor memory device of claim 1, further comprising a domain wall formed between the second portion and one of the first and third portions of the second ferromagnetic layer.

9. The semiconductor memory device of claim 1, further comprising a second electrode coupled the second ferromagnetic layer.

10. A semiconductor memory device, comprising:
an anti-ferromagnetic layer formed over a semiconductor substrate and disposed within a first region of the semiconductor substrate;
a pinned ferromagnetic layer adjacent the anti-ferromagnetic layer, pinned by the anti-ferromagnetic layer, and disposed within the first region;
a free ferromagnetic layer approximate the pinned ferromagnetic layer and disposed within the first region;

a dielectric barrier layer interposed between the pinned ferromagnetic layer and the free ferromagnetic layer for tunneling effect;

a first extended ferromagnetic layer portion extending from a first edge abutting the free ferromagnetic layer to an opposing second edge, wherein the first extended ferromagnetic layer is pinned by an additional anti-ferromagnetic feature, and disposed within a second region of the semiconductor substrate, the second region contacting the first region; and a second extended ferromagnetic layer portion extending from an third edge abutting the free ferromagnetic layer to an opposing fourth edge, disposed within a third region of the semiconductor substrate, wherein the second extended ferromagnetic layer is pinned with a magnetic orientation opposite the first extended ferromagnetic layer portion; and a transistor having a conductive feature connecting a source/drain region of the transistor with the free ferromagnetic layer and the first and second regions of the extended ferromagnetic layer;

wherein the transistor connects with the free ferromagnetic layer using an electrode, wherein the electrode extends past the first, second, third, and the fourth edges.

11. The semiconductor device of claim 10, wherein the transistor is connects to the first portion the second extended ferromagnetic layer portions.

12. The semiconductor device of claim 10, wherein the conductive feature directly interfaces with an electrode formed on the free ferromagnetic layer and the first and second extended ferromagnetic layer portions.

13. A semiconductor device, comprising:
a first memory element having:
a first ferromagnetic layer magnetically pinned and positioned within a first region of a substrate;
a second ferromagnetic layer proximate the first ferromagnetic layer, wherein the second ferromagnetic layer is rectangular in shape having a length and a width, and includes a first portion of the rectangular shape being magnetically free and positioned within the first region of the substrate, wherein the first portion has a first length in a first direction;

a second portion of the rectangular shape magnetically pinned to a first direction and positioned within a second region of the substrate, the second region contacting the first region from a first side, wherein the second portion has a second length in the first direction; and a third portion of the rectangular shape magnetically pinned to a second direction and positioned within a third region of the substrate, the third region contacting the first region from a second side, wherein the third portion has a third length in the first direction, and wherein the first length is approximately twice the second length and approximately twice the third length; and a barrier layer interposed between the first ferromagnetic layer and the first portion of the second ferromagnetic layer;

an electrode layer disposed on the first, second and third portions of the second ferromagnetic layer and wherein the electrode layer extends the length of the rectangular shape of the second ferromagnetic layer.

14. The semiconductor device of claim 13, wherein:
the first portion has a first width in a second direction, the second direction coplanar with and perpendicular to the first direction, wherein the first length is greater than the first width;

wherein the second portion has a second width in the second direction, wherein the second length is greater than the second width; and wherein the third portion has a second width in the second direction, wherein the third length is greater than the third width, and wherein the first, second and third widths are substantially equal.

* * * * *